United States Patent [19]
Pao et al.

[11] 3,914,628

[45] Oct. 21, 1975

[54] T-T-L DRIVER CIRCUITRY

[75] Inventors: Henry C. Pao, Waltham; Stephen A. Steiner, Lexington, both of Mass.

[73] Assignee: Raytheon Company, Lexington, Mass.

[22] Filed: May 13, 1974

[21] Appl. No.: 469,174

Related U.S. Application Data

[63] Continuation of Ser. No. 301,682, Oct. 27, 1972, abandoned.

[52] U.S. Cl. ................ 307/270; 307/215; 307/218; 307/236; 307/262; 307/268; 328/57

[51] Int. Cl.² ........................ H03K 1/00; H03K 3/26

[58] Field of Search ........... 307/215, 218, 236, 270, 307/262, 268; 328/57, 92

[56] References Cited

UNITED STATES PATENTS

| | | | |
|---|---|---|---|
| 3,229,119 | 1/1966 | Bohn | 307/215 |
| 3,560,760 | 2/1972 | Chung | 307/215 |
| 3,624,620 | 11/1971 | Andrews | 307/270 |
| 3,648,060 | 3/1972 | Hagen | 307/215 |
| 3,654,490 | 4/1972 | Kan | 307/262 |
| 3,660,676 | 5/1972 | Fleischhammer | 307/218 |
| 3,662,191 | 5/1972 | Aley | 307/270 |
| 3,681,615 | 8/1972 | Ricci | 307/215 |
| 3,699,355 | 10/1972 | Madrazo | 307/215 |

*Primary Examiner*—Stanley D. Miller, Jr.
*Attorney, Agent, or Firm*—Richard M. Sharkansky; Philip J. McFarland; Joseph D. Pannone

[57] ABSTRACT

Improved T-T-L driver circuitry is disclosed to provide a pair of complementary signals at the outputs of a pair of output stages, each one of such stages having a totem pole, or active pull-up, transistor arrangement. Also disclosed are networks which enable the driver circuitry to respond to a standby or inhibit signal.

2 Claims, 4 Drawing Figures

T-T-L DRIVER CIRCUITRY

CROSS REFERENCE TO RELATED CASES

This is a continuation of application Ser. No. 301,682, filed Oct. 27, 1972, now abandoned.

BACKGROUND OF THE INVENTION

This invention relates generally to driver circuitry and more particularly to T-T-L driver circuitry adapted to provide a pair of complementary output signals and suitable for integrated circuit fabrication.

As is known in the art, it is frequently desirable to provide a driver adapted to provide a pair of complementary signals at its outputs. For example, if an "*n*" bit word is to be converted into an enable signal on one of $2^n$ lines, a driver (sometimes referred to as a decoder driver) may be provided to produce a true and complement signal corresponding to each one of the "*n*" bits. T-T-L gating circuitry, including a so-called totem pole, or active pull-up, transistor configuration may be incorporated in some types of decoder drivers. With T-T-L gating circuitry of such nature, the capacity of the load may be varied within wide limits without seriously affecting the speed of operation of the whole circuit. Unfortunately, however, if a pair of complementary output signals are required, there are no known totem pole, or active pull-up, transistor configurations for such purpose.

It is sometimes desirable to have a means for placing the devices driven by a number of decoder drivers in an inhibit or standby mode. This is generally accomplished by having the outputs of each one of the drivers high (or low) in response to a standby signal. In a known decoder such standby means is mechanized by including a common bus to the outputs of each one of the drivers. When such decoder is fabricated as an integrated circuit this bus requires a significant space allocation, thereby reducing the number of devices which can also be fabricated in such integrated circuit.

SUMMARY OF THE INVENTION

With this background of the invention in mind, it is an object of the invention to provide T-T-L driver circuitry adapted to provide a pair of complementary output signals, such circuitry having an active pull-up transistor configuration in each of its pair of output stages, the contemplated circuitry being more suitable for integrated circuit fabrication than known circuitry using an active pull-up transistor configuration.

This and other objects of the invention are attained generally by providing a T-T-L driver wherein a phase splitter network is coupled to a pair of output stages, each one of such stages having a totem pole or active pull-up transistor configuration. In each of the pair of output stages one of the pair of transistors in such pull-up configuration is coupled to the phase splitter through an inverter network.

BRIEF DESCRIPTION OF THE DRAWINGS

The foregoing features of this invention, as well as the invention itself, may be more fully understood from the following detailed description read together with the accompanying drawings in which.

DESCRIPTION OF THE PREFERRED EMBODIMENTS

Figure 1:
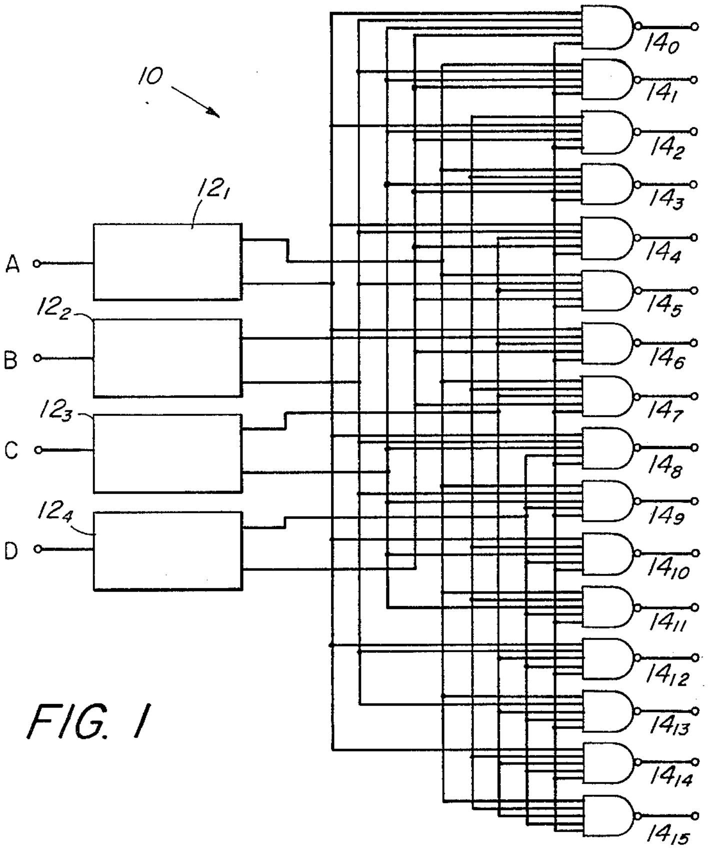
FIG. 1 is a block diagram of a binary decoder according to the invention.

Referring now to FIG. 1 a 4-line-to-16-line decoder 10 is shown. It is here noted that such decoder 10 is adapted for fabrication on a monolithic integrated chip (now shown). It is noted in passing that other elements may be on the same chip such as a matrix of storage elements. The decoder 10 is shown to include drivers $\mathbf{12_1}$–$\mathbf{12_4}$, the details of which will be described. Suffice it to say here that NAND gates $\mathbf{14_0}$–$\mathbf{14_{15}}$ are connected to the drivers $\mathbf{12_1}$–$\mathbf{12_4}$ in a conventional manner, as shown, to decode four binary input signals A, B, C, D,: i.e. a 4 bit word is converted into an enable signal on a single one of sixteen mutually exclusive lines (not numbered) out of the NAND gates $\mathbf{14_0}$ . . . $\mathbf{14_{15}}$.

Figure 2:
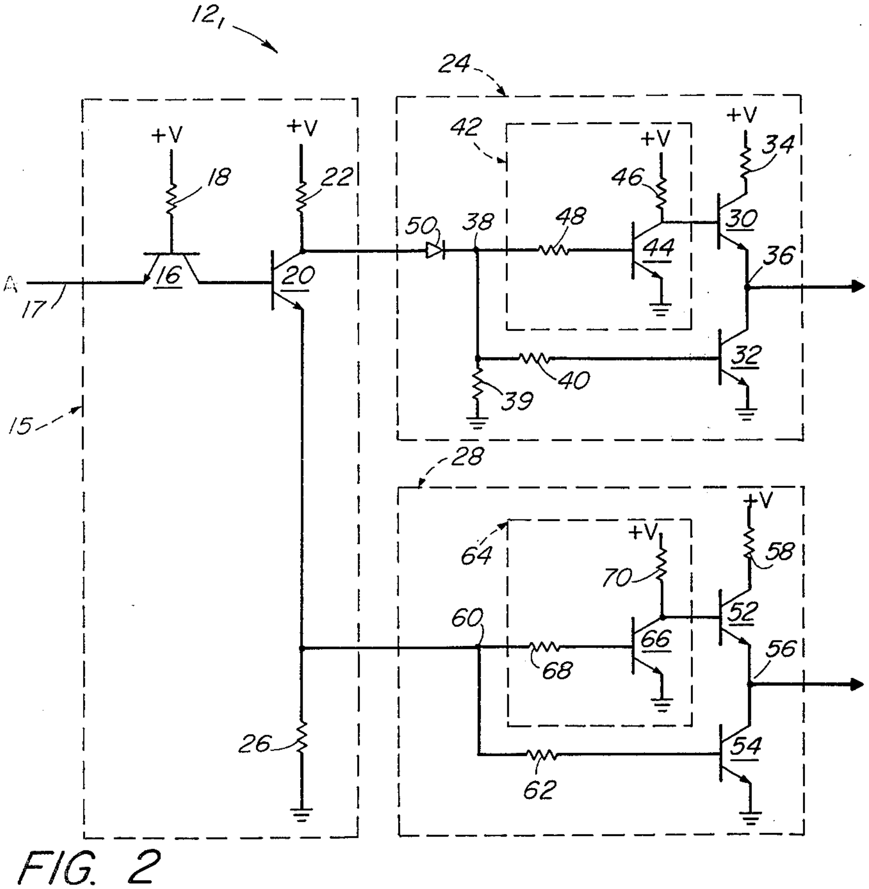
FIG. 2 is a schematic diagram of a driver for use in the binary decoder in FIG. 1.

An exemplary one of the drivers, say $\mathbf{12_1}$, is shown in FIG. 2. A phase splitter network 15 is shown to include an input transistor 16 arranged in a T-T-L configuration. In particular, such transistor has an emitter electrode adapted for coupling (via line 17) to one of the four binary input signals, here A; a base electrode connected to a +V power supply through a resistor 18; and a collector electrode connected to the base electrode of a transistor 20. Transistor 20 has its collector electrode connected to a +V power supply through a resistor 22 and its emitter electrode connected to ground through a resistor 26 in what is commonly referred to as an emitter follower configuration. It is here noted that the signals at the collector electrode and emitter electrode of transistor 20 are complementary. That is, phase splitter 15 produces at its outputs (i.e. the emitter and collector electrodes of transistor 20) a true and complement signal from the input signal, A.

A pair of output stages 24, 28 are coupled respectively to collector electrode and emitter electrode of transistor 20, as shown. Output stage 24 includes a pair of transistors 30, 32 arranged as shown in a totem pole or active pull-up arrangement. Such arrangement is described in "Designing With TTL Integratd Circuits" edited by R. L. Morris and J. R. Miller, published by McGraw-Hill Book Company, N.Y. 1971 on pages 23 to 25. In particular, transistor 30 has its collector electrode connected to a +V power supply through a resistor 34, its emitter electrode connected to the collector electrode of transistor 32. Transistor 32 has its emitter electrode connected to ground. An output terminal 36 is formed between the transistors 30, 32. The base electrode of transistor 32 is connected, as shown, to a terminal 38 (through a resistor 40) and to ground (through resistor 40 and a resistor 39). The base electrode of transistor 30 is connected to such terminal 38 through an inverter 42. Inverter 42 includes a transistor 44, the emitter electrode thereof being connected to ground, the collector electrode being connected to a +V power supply through a resistor 46, and the base electrode being connected to terminal 38 through a resistor 48. Terminal 38 is connected to the collector electrode of transistor 20 through a diode 50. It is noted that resistors 40 and 48, here illustrated schematically, are in reality the inherent resistance in the connections formed on the monolithic integrated circuit chip to the base electrodes of transistor 30, 32.

Output stage 28 includes a pair of transistors, 52, 54, also arranged in a totem pole or active pull-up arrangement. Transistor 52 has its emitter electrode connected to the collector electrode of transistor 54 with an output terminal 56 formed therebetween as shown. The collector of transistor 52 is connected to a +V power supply through a resistor 58. The emitter electrode of transistor 54 is connected to ground. The base electrode of transistor 54 is connected to a terminal 60 through a resistor 62. The base electrode of transistor 52 is connected to such terminal 60 through an inverter 64. Such inverter includes a transistor 66, the base electrode thereof being connected to terminal 60 through a resistor 68, the collector electrode being connected to a +V power supply through a resistor 70 and the emitter electrode being connected to ground. Terminal 60 is connected to phase splitter 15(i.e. the emitter electrode of transistor 20). It is here noted that resistors 62 and 68, here represented schematically, are in fact inherent resistance in the connections formed on the monolithic integrated circuit chip to the base electrodes of transistors 52, 54.

In operation when the binary input signal A applied to phase splitter 15 via line 17 is high, (i.e. a voltage greater than ~ 1.4 volts), transistor 16 is driven "off". Therefore, current flows from the +V power supply, through resistor 18, the base-collector region of transistor 16 and the base-emitter region of transistor 20, resistor 26 to ground, thereby turning transistor 20 on. The current flow through resistor 26 causes a sufficient positive voltage to be developed at terminal 60 to: Turn transistor 54 on; and, because of inverter 64, turn transistor 52 off. It is noted that the collector electrode of transistor 16 becomes clamped to about 1.4 volts because the emitter-base region voltage drops $V_{be}$ of transistors 20 and 54 are about 1.4 volts. Therefore, the conventional T-TL $2V_{be}$ threshold criterion is established. It follows then that the output terminal 56 goes low and produces the complement of the input signal, (i.e. A). Further, the current flow through transistor 20 lowers the voltage at the collector electrode thereof thereby turning transistors 44 and 32 off. Transistor 30 is turned on, however, by base current flow from the +V power supply through resistor 46. Consequently, the voltage at output terminal 36 is high and produces the true of the input signal, (i.e. A).

Figure 3:
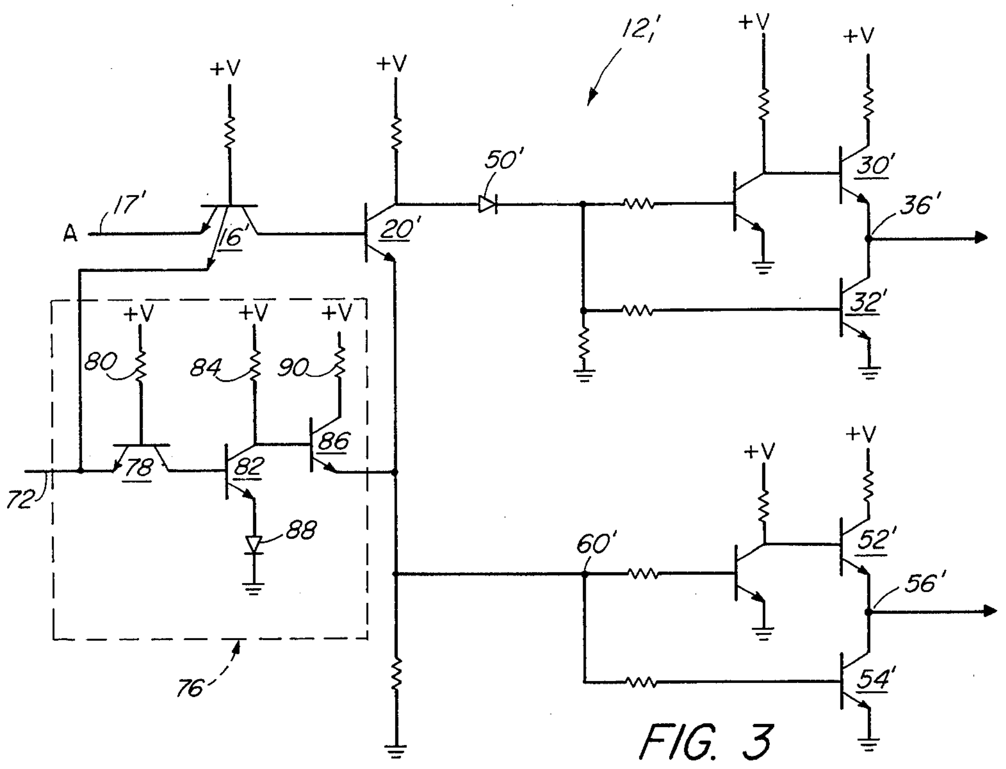
FIG. 3 is a schematic diagram of an alternate embodiment of the driver of FIG. 2; and, FIG. 4 is a schematic diagram of an alternate embodiment of the driver of FIG. 2.

Conversely, if the binary input signal is low (that is, less than ~ 1.4 volts), transistor 16 turns on and, because of the low voltage on the base electrode of transistor 20, such transistor 20 turns off. Therefore, terminal 60 goes to ground potential, turning off transistor 54, and transistor 52 turns on because of base current flow from the +V power supply through resistor 70. The signal at the output terminal 56 goes high, which again is the complement of the binary input signals, (i.e. A). Further, because transistor 20 is off, the voltage at the collector electrode of such transistor goes high and thereby forward biases diode 50. Likewise, the voltage at terminal 38 goes high, causing transistor 32 to turn on and transistor 30 to turn off. The signal at the output terminal 36 goes low and again is the true of the binary input signal, (i.e. A). Referring now to FIG. 3, a driver $12_1'$ is shown. Such driver is adapted for connection to a standby signal via line 72. As will be described when such standby signal is high, the driver $12_1'$, in response to the binary input signal applied to line 17', produces a true and complement of such signal at output terminals 36' and 56' respectively. However, if such standby signal is low, the driver produces, at output terminals 36' and 56', a pair of low signals.

Referring to FIG. 1, if the decoder 10 was modified so that driver $12_1$ was replaced by driver $12_1'$ (FIG. 3) and the NAND gates $14_0$–$14_{15}$ were replaced by AND gates $14_0'$–$14_{15}'$ (not shown), such as a multi-emitter transistor, the introduction of a low standby signal to one driver, namely to line 72 of driver $12_1'$, would produce a low signal at the output of all the AND gates $14_0'$–$14_{15}'$.

Referring now in detail to FIG. 3, driver $12_1'$ is shown to be equivalent to driver $12_1$ except: (1) transistor 16 of driver $12_1$ is replaced by a multi-emitter transistor 16', and (2) a network 76 is connected to: line 72; an emitter electrode of transistor 16'; and, the emitter electrode of transistor 20', as shown. Network 76 includes a transistor 78, the emitter electrode thereof being connected to line 72 and to an emitter electrode of transistor 16' (as shown), a base electrode connected to a +V power supply through resistor 80, and a collector electrode connected to the base electrode of a transistor 82. The collector electrode of transistor 82 is connected to a +V power supply through a resistor 84 and to the base electrode of a transistor 86. The emitter electrode of transistor 82 is connected to ground through a diode 88. Transistor 86 has its collector electrode connected to a +V power supply through a resistor 90, and its emitter electrode connected to the emitter electrode of transistor 20'.

In operation when the standby signal applied to line 72 is high, transistor 78 is driven off and transistor 82 is driven on by base current flow from the +V power supply through resistor 80 and the base-collector region of transistor 78. Transistor 86 is, therefore, driven off because of the relatively low voltage on its base electrode. It follows then that, when the standby signal is high, the signals produced at the output terminals 36' and 56' are the true and complement of the binary input signal applied to line 17' for the reasons discussed in reference to FIG. 2. Conversely, when the standby signal applied to line 72 is low, transistor 16' and 78 turn on. Therefore, transistor 20' is driven off (because of the low voltage on its base electrode) and transistor 86 is driven on (because transistor 82 is driven off and current flows from the +V power supply through resistor 84). Consequently, the voltage at terminal 60' goes high, turning transistor 54' on, transistor 52' off, thereby developing a low voltage at output terminal 56' as discussed in FIG. 2. Likewise, for reasons discussed, diode 50' becomes forward biased turning transistor 32' on, transistor 30' off thereby developing a low voltage on output terminal 36' also. Therefore, such low standby signal effectively decouples line 17' from output terminals 36' and 56'. That is, the signals at such terminals are both low when driver $12_1'$ responds to such low standby signal.

Figure 4:
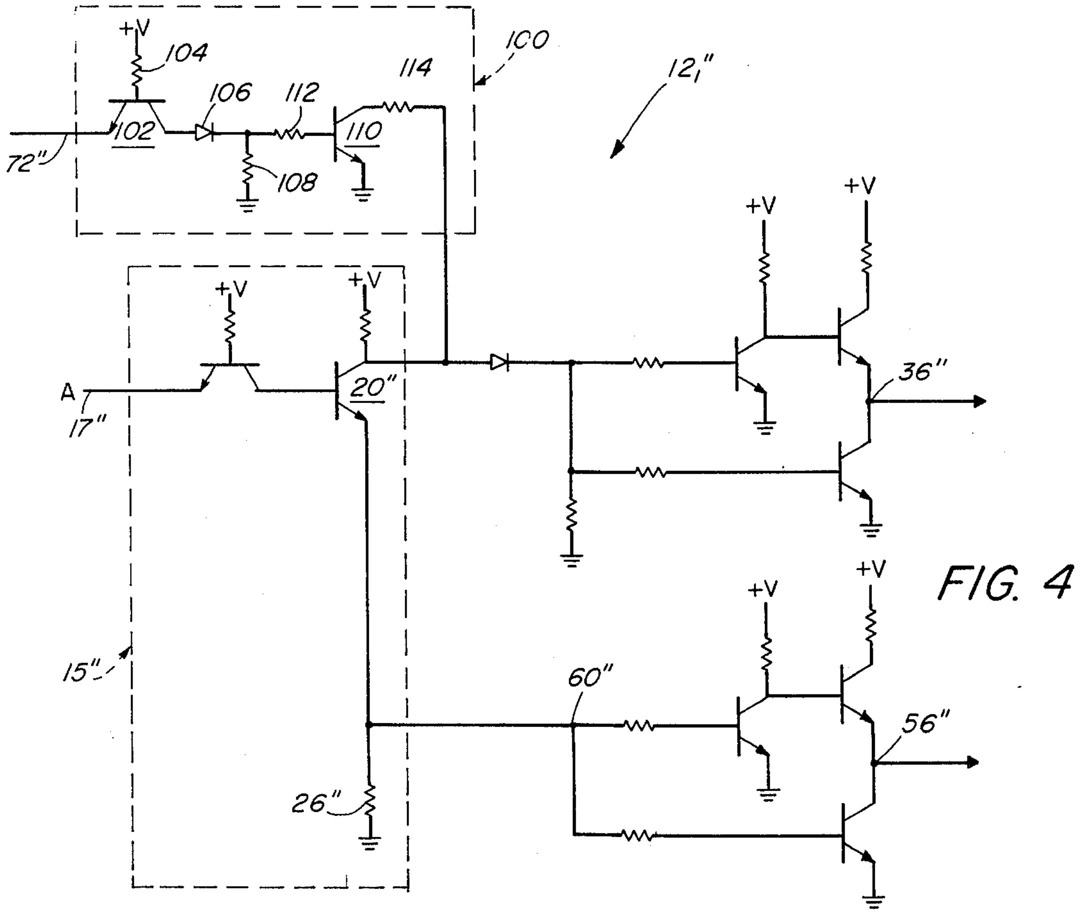

Referring now to FIG. 4, a driver $12_1''$ is shown. Such driver is adapted for connection to a standby signal on line 72''. As will be described, when the driver responds to a standby signal that is high the signals produced at output terminals 36'' and 56'' are both likewise high. Conversely, when the driver responds to a standby signal on line 72'' that is low, the signals at terminals 36'' and 56'' are the true and complement of the binary signal applied to line 17''.

Referring now to the details of driver $12_1$'', such driver is shown to include a network 100 in circuit between line 72'' and the collector electrode of transistor 20''. Such network 100 includes a transistor 102, the emitter electrode being coupled to line 72'', the base electrode being connected to a +V power supply through a resistor 104 and the collector electrode being connected to a diode 106. The diode 106 is connected to ground through a resistor 108 and to the base electrode of transistor 110 through a resistor 112. Transistor 110 has its emitter electrode connected to ground and its collector electrode connected to the collector electrode of transistor 20'' through resistor 114.

In operation when the standby signal on line 72'' is high, transistor 102 turns off and base current flows to transistor 110 from the +V power supply through the base collector region of transistor 102, diode 106 and resistor 112, thereby turning transistor 110 on. When transistor 110 turns on the collector electrode of transistor 20'' goes to ground, thereby turning such latter transistor off. Consequently, because of the absence of current flow through resistor 26'', terminal 60'' goes to ground. That is, the outputs of phase splitter 15'' are grounded. It follows then that the signals on lines 36'' and 56'' are both high. Conversely, when the standby signal on line 72'' is low, transistor 102 turns on, transistor 110 turns off and network 100 becomes decoupled from output terminals 36'' and 56''. Under this condition driver $12_1$'' is equivalent to the driver 12 shown in FIG. 1 and the signals produced at output terminals 36'' and 56'' are the true and complement of the binary input signal applied to line 17''.

While the invention has been described for a decoder driver, it is obvious that other applications, such as clock drivers and demultiplexers may be adopted to utilize this invention in order to obtain the same advantages. It is felt, therefore, that the invention should not be restricted to its disclosed embodiments, but rather should be limited only by the spirit and scope of the appended claims.

What is claimed is:

1. Driver circuitry comprising:

a. phase splitter means for developing complementary signals at a pair of output terminals, such means including:
   i. a coupling transistor, the emitter electrode thereof for connection to a binary signal source; and,
   ii. an emitter follower transistor having:
      a. base electrode connected to the collector electrode of such coupling transistor; an emitter electrode connected to one of the pair of output terminals, and, a collector electrode connected to the other one of the pair of output terminals; and,
      b. a pair of output stages, each one thereof coupled to said emitter follower transistor at a different one of the pair of output terminals, each one of such stages including a pair of transistors arranged in an active pull-up configuration, the base electrode of one of the pair of transistors in each one of the stages being connected to a different one of such pair of output terminals through only passive elements.

2. The driver circuitry recited in claim 1 including additionally a network, such network having an input terminal for connection to a standby signal source and an output terminal connected to an electrode of said emitter follower transistor.

* * * * *